United States Patent [19]

Wood

[11] Patent Number: 4,737,725
[45] Date of Patent: Apr. 12, 1988

[54] FILTER OVERSHOOT CONTROL CIRCUITRY

[76] Inventor: James B. Wood, 1305 Fair Ave., Santa Cruz, Calif. 95060

[21] Appl. No.: 57,378

[22] Filed: Jun. 2, 1987

[51] Int. Cl.$^4$ .............................................. H03K 5/08
[52] U.S. Cl. ..................................... 328/169; 307/542
[58] Field of Search ................ 307/520, 542; 328/162, 328/165, 167, 169

[56] References Cited

U.S. PATENT DOCUMENTS 4,460,871  7/1984  Orban ................................... 328/169

Primary Examiner—Gene Wan
Assistant Examiner—Steven J. Mottola
Attorney, Agent, or Firm—John J. Leavitt

[57] ABSTRACT

Presented is a control circuit for controlling, i.e., preventing, filter overshoot in stereophonic broadcast equipment, particularly stereophonic FM broadcasting equipment. The circuitry includes an input clipper cooperating with a phase-lag network and a second clipper to condition the primary information signal to anticipate filter overshoot and counteract it through cooperation of comparator and summing circuits that add back into the amplitude-limited signal the clipped off components that exceed in amplitude the amplitude-limited signal, but which are added back in opposite phase.

9 Claims, 2 Drawing Sheets

FILTER OVERSHOOT CONTROL CIRCUITRY

BACKGROUND OF THE INVENTION

1. Field of the Invention.

This invention relates to the field of stereophonic FM broadcasting, and more particularly to a method and circuitry for precluding or minimizing to a negligible level the degree of overshoot of a lowpass filter network beyond a predetermined signal excursion limit.

2. Description of the Prior Art.

A preliminary patentability search was conducted in the following classes and sub-classes with respect to the subject invention:

- Class 307—sub-classes 543; 546; 547 and 556.
- Class 328—sub-classes 169; 170; 171 and 175.
- Class 330—sub-classes 126 and 151; and
- Class 381—sub-classes 13; 14; 94 and 106

As a result of the search in this area, eight (8) U.S. patents as follows were found:

U.S. Pat. Nos. 3,651,339; 3,968,384; 3,986,049; 4,110,692; 4,103,243; 4,208,548; 4,241,266; 4,441,199.

In addition, three additional U.S. patents have come to my attention and have been considered, and are identified as U.S. Pat. Nos. 4,134,074; 4,383,229; and 4,460,871

Of the eight patents listed above that were found as a result of the search, none appear to be relevant with respect to the invention described herein. Of the three patents listed in the immediately preceeding paragraph, only U.S. Pat. Nos. 4,134,074 and 4,460,871 appear to have any pertinency.

U.S. Pat. No. 4,134,074 to Hershberger directly addresses the problem of lowpass filter overshoots in stereophonic FM broadcasting. However, the method and apparatus taught by Hershberger are different in structure and function from the method and apparatus forming the subject matter of the instant invention. In Hershberger, two nearly identical lowpass filters are placed in the signal path. The amplitude overshoots of the first filter are isolated from and recombined with the signal in such a way that they cancel not only the first filter overshoots, but predict and inhibit overshoots in the second filter as well. Thus, the Hershberger U.S. Pat. No. 4,134,074 circuit satisfies the requirement with full consideration to the bandwith and amplitude constraints, but at the expense of a second, otherwise redundant lowpass filter circuit. In addition, another disadvantage of the Hershberger circuit, is that it calls for a constant "group delay" characteristic in the second filter, no small matter in filters of the higher order, more complex designs common to FM broadcasting.

U.S. Pat. No. 4,460,871, issued approximately five and a half years after Hershberger U.S. Pat. No. 4,134,074, constitutes a refinement of the concept disclosed by Hershberger. In Orban's U.S. Pat. No. 4,460,871 circuit, the primary lowpass filter is permitted to overshoot in the expected manner. Overshoots are again isolated and reintroduced to the signal path in a manner which opposes and thus cancels the amplitude over excursions. Rather than pass the entire "corrected" signal through a second lowpass filter as is done in Hershberger, only the isolated overshoots are filtered before reintroduction. Thus, in addition to an otherwise redundant low-pass filter, Orban's U.S. Pat. No. 4,460,871 calls for signal equalization, a second "safety" clipper and a third, yet simple, lowpass filter element.

Thus, with respect to U.S. Pat. Nos. 4,134,074 and 4,460,871, each of these patents discloses at least one low-pass filter or other means of program bandwith restriction which, itself, exhibits normal amplitude overshoot characteristics.

Additionally, in each of these patents some means is required to isolate and control the amplitude overshoots of the first lowpass element, but at the expense of harmonic generation.

Still further, in each of these patents, a second low pass filter element is employed to suppress signal harmonics generated by overshoot correction circuitry.

Accordingly, one of the primary objects of the present invention is to eliminate much of the circuitry required by these patents and to provide overshoot protection by a much simpler circuit utilizing fewer components.

Still another object is the provision of an overshoot protection circuit which eliminates the need for multiple low-pass filter assemblies.

A still further object is the provision of a filter overshoot control circuitry that may be used with almost any variety of existing lowpass filter designs including those already in place in commercial broadcasting equipment.

Yet another object of the invention attendant to the factor of simplicity in design, is the provision of filter overshoot control circuitry which presents a more direct signal path to the audio program, lessening the chance for sonic degradation.

Since the filter overshoot control circuitry of this invention may be utilized with existing lowpass filter designs that are already in place in commercial broadcast equipment, another object of the invention is to lessen considerably the cost of implementing filter overshoot control circuitry in already in place commercial broadcast equipment.

The invention possesses other objects and features of advantage, some of which, with the foregoing, will be apparent from the following description and the drawings. It is to be understood however that the invention is not limited to the embodiment illustrated and described since it may be embodied in various forms within the scope of the appended claims.

SUMMARY OF THE INVENTION

In terms of broad inclusion, the filter overshoot control circuitry of the invention comprises a first clipping circuit which functions to establish input signal amplitude limits, cooperating with a phase-lag network which displaces high frequency signal components with respect to low frequency signal components, and a second clipping circuit to re-establish signal amplitude limits, with the output therefrom being fed into a comparator circuit which recovers those signal components lost in the second clipping process, and which feeds such signal components into combining circuitry to re-introduce recovered, clipped signal components from the second clipping operation back into the primary information signal, but in opposite phase.

DESCRIPTION OF THE PREFERRED EMBODIMENT

Figure 1:
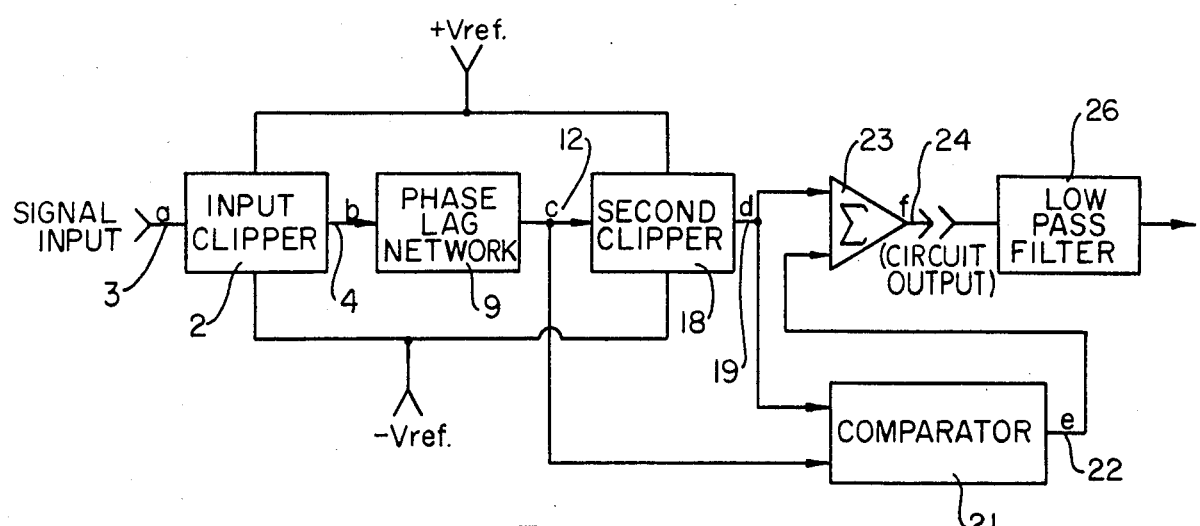
FIG. 1 is a block diagram illustrating the filter overshoot control circuitry.

The current or conventional system for stereophonic FM radio broadcasting used world-wide is believed to be one of frequency-division multiplexing. The stereophonic program consists of a "left" and a "right" channel of audio information. The left-plus-right "sum" signal modulates an audible-range "base band" which extends in frequency from a nominal 30 Hz to 15 kHz. The left-minus-right "difference" signal amplitude-modulates a suppressed-carrier "subcarrier" centered at 38 kHz, the resultant sidebands occupying the range of 23 kHz to 53 kHz. A "pilot" signal is inserted at 19 kHz, and additional subcarriers not related to the program signal may optionally be added above the upper sideband edge beyond 53 kHz. An analysis of the total "composite" signal shows that if the program audio signal contains frequency components above 15 kHz, these higher frequencies could interfere with the pilot and non-program subcarrier signals, or even cause the base band and lower sideband to "alias" or interfere with one another. To prevent these potential problems, sharp-cut off lowpass filters are customarily placed in the audio signal path to strictly limit the program frequency range to 15 kHz.

Common broadcasting practice also places a limit on the peak deviation, or modulation of the FM broadcast "carrier" frequency to guard against interference between stations. This translates directly to a limit placed on the peak amplitude of the modulating program audio signal in addition to the limit imposed on signal bandwith.

The two signal constraints are difficult to realize simultaneously. Even the most fastidious lowpass filter designs will invariably exhibit a certain degree of signal overshoot, due both to the naturally uneven phase response of the filter and to the filters normal and desired elimination of higher order frequency components which, themselves, help define the instantaneous signal peak amplitude. It is not uncommon for the comparatively steep filters used in FM broadcasting to deliver output amplitude excursions up to twice the value of an amplitude-limited input signal. Means to compensate for, or to negate lowpass filter amplitude overshoots, have thus been necessarily devised.

Some solutions which have been devised to cope with lowpass filter overshoots generally fall into the "brute" force category. Though they may meet the requirements in a literal sense, they are not without a performance tradeoff, usually resulting in audible degradation of the audio program signal.

In one instance, for example, a frequency-selective clipping circuit has been proposed. This circuit reduces the signal clipping threshold as the audio frequency increases. Overtones which are harmonically related to low frequency fundamentals are reduced to levels which cause no filter overshoots. However, high frequency fundamental signals which would not necessarily cause an overshoot problem in the first place are similarly limited. Not only is the high frequency performance of the system audibly degraded, but the unnecessary clipping increases signal intermodulation distortion to intolerable levels.

Another "solution" is the arrangement of a succession of cascaded filter and clipping circuits to approximate the required signal control. In practice, however, a filtering circuit as the final stage will still exhibit overshoots and, similarly, a last-stage clipper will generate harmonics which exceed the signal bandwidth constraint.

Nonetheless, a refinement of this "solution" is the subject of U.S. Pat. No. 4,383,229 to Jones noted above. This patent specifically references the FM broadcasting dilemma, and the design concept illustrated by the patent suggests that certain resonant elements of the subject lowpass filter can eliminate the harmonics generated by clipping circuits embedded within the filter circuitry. Reduction to practice of this design reveals the primary shortcomings, which are that clipping-generated harmonics are reduced in only a relatively narrow range of frequencies, and that the harmonic attenuation even at these critical frequencies is only marginally sufficient by accepted broadcasting standards. Both of these facts are noted in the patent.

As noted above, U.S. Pat. No. 4,134,074 specifically addresses the problem of filter overshoot with reference to FM broadcasting. In this patent, two nearly identical lowpass filters are placed in the signal path, one after the other. The amplitude overshoots of the first filter are isolated from, and recombined with the filtered signal in such a way that they "predict" similar overshoots in the second filter and provide a subtraction and cancellation thereof. This "solution" satisfies the requirement with full consideration of the bandwith and amplitude constraints, and reduced to practice, it performs very acceptably, but does require an otherwise-redundant lowpass filter circuit. In addition, this patent calls for a constant "group delay" characteristic in the second filter, thus measurably increasing the cost of the "solution".

To be convinced that the problem is not a simple one, and that the industry has been looking for a long time for a solution to the problem, all that is required is that one analyze U.S. Pat. No. 4,460,871. The "solution" taught by this patent is to provide a program audio signal which is both amplitude-and-bandwidth-limited by a complex scheme which utilizes a system of frequency division, linear gain control within mulitple frequency bands, signal clipping and lowpass filtering. The resultant signal nonetheless contains amplitude overshoots which are then isolated by a "center-clipper", lowpass-filtered to remove clipping-induced harmonics, and finally subtracted from the primary program signal to effectively cancel the overshoots without adding out-of-band frequency components. Nonetheless, a final phase-corrected lowpass filter and "safety" clipper circuit follow the overshoot-compensation circuitry. While this design has been proved in practice, it is relatively complicated. For instance, it calls for the use of three separate lowpass filter elements, two signal relay networks, and special frequency equalization within certain branches of the signal path.

It should therefore be apparent that there is a real need in this industry for a relatively simple and low cost circuitry to provide filter overshoot protection. It is believed that the circuit forming the subject matter of this invention fills that need.

Thus, in terms of greater detail, my invention comprises comparatively simple signal-conditioning circuitry which not only places limits on the peak amplitude excursions of an input signal, but further conditions the limited input signal so as to inhibit overshoots in a subsequent lowpass filter assembly. Additionally, the lowpass filter attendant to the invention need not be tailored for use with this invention. Any popular passive or active lowpass filter configuration common to FM broadcasting service is equally suited for use in connection with this invention.

Figure 2:
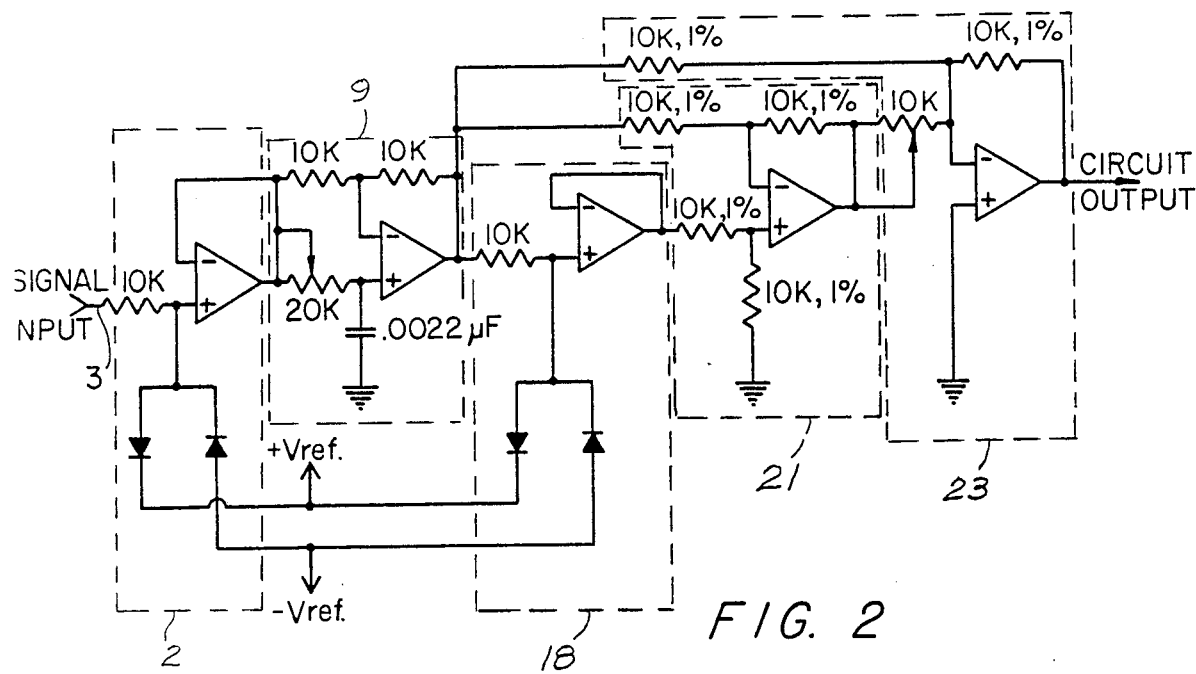
FIG. 2 is a schematic diagram of the filter overshoot control circuitry.

As illustrated in FIGS. 1 and 2, a simple diode input clipping circuit 2 is biased to a DC level (+/−Vref) representing the desired output amplitude limit. Signals not otherwise restricted in level by usual compression or amplitude limiting means common to broadcasting practice are input through lead 3 and will be clipped at the +/−Vref. voltage by the input clipper 2.

Due either to this clipping action or to the effects of previous program signal processing, or simply to the harmonic phase relationships within the complex program input signal, the input clipper 2 ouput signal 4 will necessarily contain frequency components which would otherwise cause a subsequent lowpass filter to overshoot the amplitude constraints of +/−Vref. As illustrated in FIG. 4(B), the signal 4 is simplified for this discussion to a worst-case, "squared-off" wave form with a lower fundamental frequency 6 and higher-order harmonics taking the form of steep, fast-rise leading and trailing wave form edges 7 and 8, respectively.

A first-order phase-lag network 9 shifts the fundamental/harmonic relationship of the squared wave form 4 to offset the harmonics in time as indicated at 12. This single-section phase-lag network 9 can shift the phase of the higher signal frequency components a maximum of 180 degrees, a figure of fundamental/harmonic phase displacement generally acknowledged as indiscernible in subjective listening tests, but in any case secondary to the greater displacement attributable to the inevitable lowpass filter.

Figure 4A:
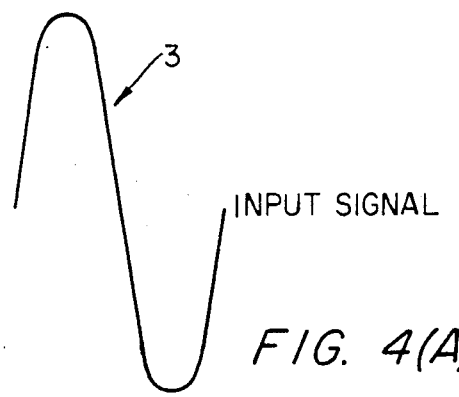
FIGS. 4(A), 4(B), 4(C), 4(D), 4(E) and 4(F) illustrate signal wave-forms at various circuit points.
Figure 4D:
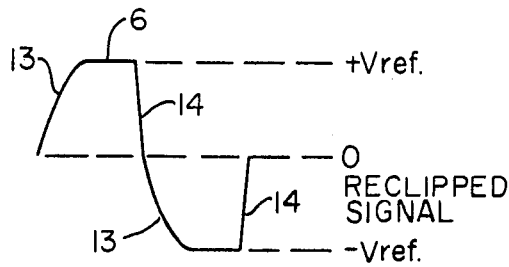
Figure 4B:
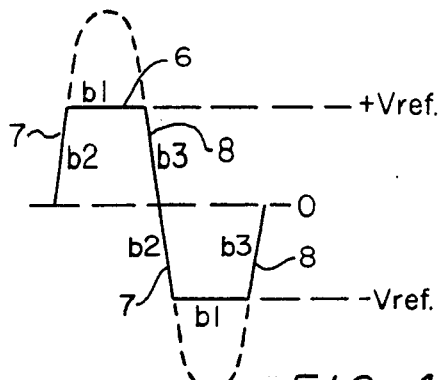
Figure 4E:
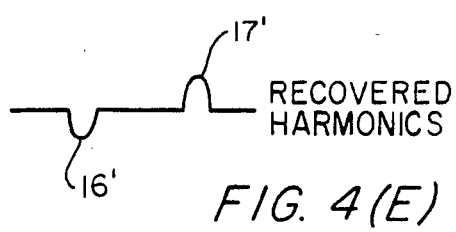
Figure 4C:
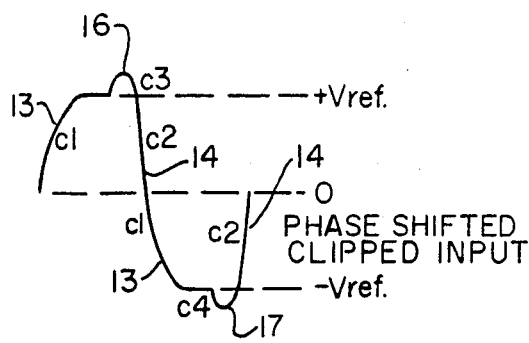
Figure 4F:
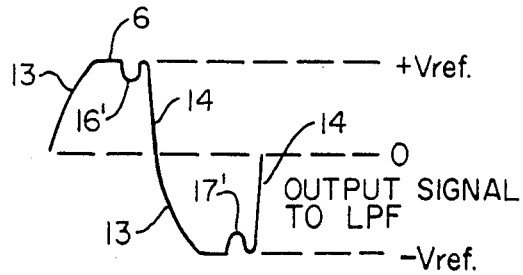

The phase-lag network 9 thus provides a controlled and predictable signal waveform risetime 13 and falltime 14 as indicated in FIG. 4(C), but at the expense of re-violating the +/−Vref. amplitude constraint. Stated in other words, the signal harmonics 16 and 17 (FIG. 4C) have been shifted in time and out of the "risetime domain" so that they instead add back to the amplitude of the fundamental frequency.

A second clipper circuit 18 restores the +/−Vref. amplitude limit 18, but in so doing, it removes the original signal harmonics. A differential comparator circuit 21 monitors both the input to lead 12 and therefore the second clipper 18, and the output 19 from the second clipper 18 to recover the clipped-off harmonics at the output 22 of the comparator. These clipped-off harmonics are then recombined with the amplitude-limited signal 19 in a summing amplifier 23. Because the comparator 21 inverts the phase of the clipped harmonics at 22, they subtract from, rather than add to the amplitude of the limited fundamental signal 19. Thus the final output signal at 24 does not exceed the +/−Vref. limits within the passband of the subsequent lowpass filter 26, and the signal-conditioned output signal 24 from the overshoot control circuitry can be said to "undershoot" by an amount equal to the overshoot of the lowpass filter.

The re-clipped signal 19 is illustrated in FIG. 4(D), while the clipped-off harmonics 22 constituting the output of comparator 21 are illustrated in FIG. 4(E). The effect of recombining the clipped-off harmonics with the amplitude-limited signal 19 is illustrated in FIG.(4F). It may thus be said that the input to the lowpass filter has been "pre-conditioned" by anticipating the amount of the overshoot of the lowpass filter, and conditioning the input by subtracting that amount (undershoot) from the input signal 24.

While the circuitry described above compensates for, and thus eliminates overshoot in a subsequent lowpass filter, this serves only to satisfy the program signal amplitude contraints. It is assumed for purposes of this discussion that the program bandwith constraint is satisfied by adequate design of the lowpass filter circuit itself.

Figure 3:
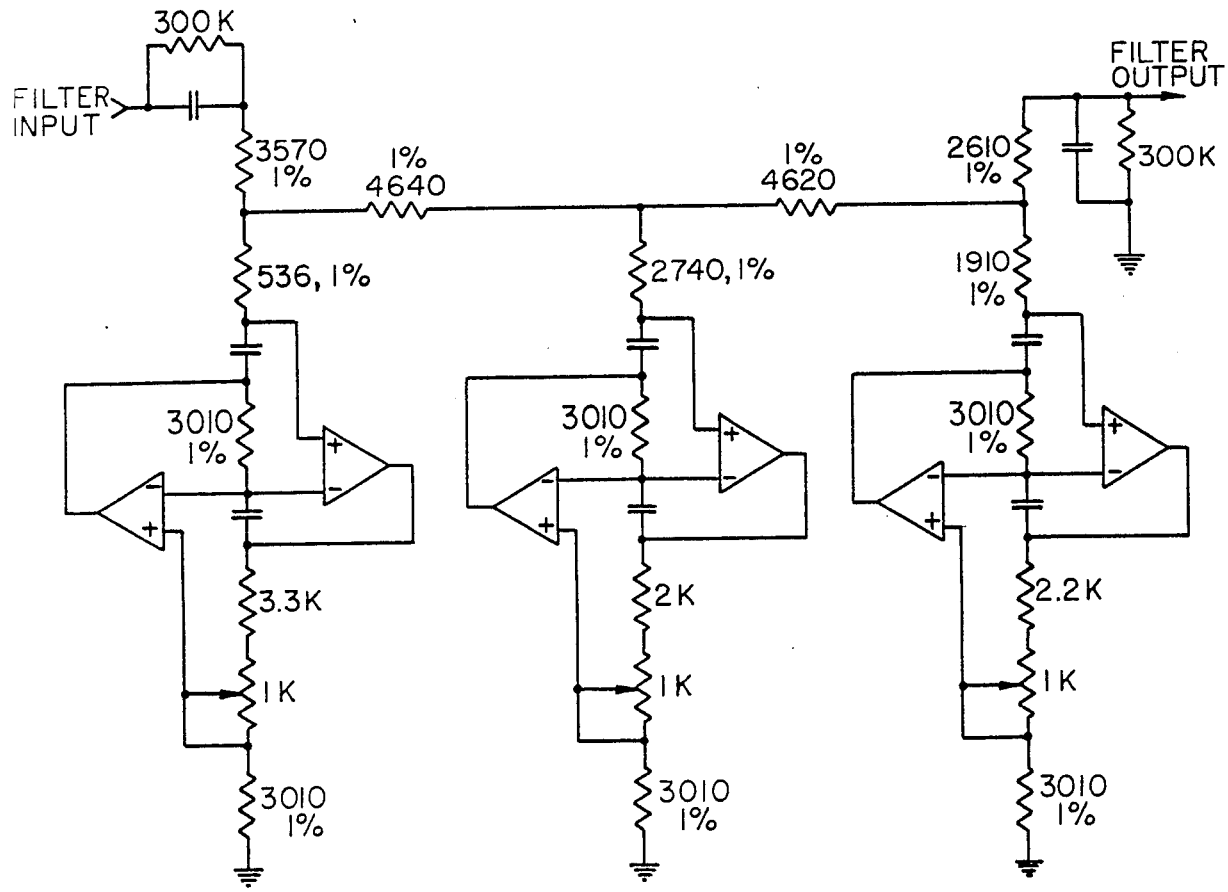
FIG. 3 is a schematic diagram of a lowpass filter design typical of what might be encountered in broadcasting practice. This example 7-pole, elliptic-function active filter is derived from textbook formulas and no claim of novelty or patentable invention is made with respect thereto.

In practice, certain component parts within the overshoot control circuifry may be made variable so as to compensate for the overshoot characteristics of a wide range of lowpass filter circuit designs traditionally utilized in broadcasting. Such a filter design is diagrammed in FIG. 3. The circuit illustrated in FIG. 3 constitutes, as an example, a 7-pole, elliptic-function active filter and is derived from textbook formulas and is typical of what might be encountered in broadcasting practice. No claim of novelty or patentable invention in the circuit illustrated in FIG. 3 is claimed herein. I have found that sinewave response of the overshoot control circuitry is frequency-flat and unaffected at levels below the predetermined output limit (+/−Vref.), save for a 180 degree (or less) phase lag at the highest audio frequency. Though this delay adds to similar, yet normally much greater high frequency delays in the subsequent lowpass filter assembly, even several "rotations" (multiples of 360 degrees) at a 15 kHz cutoff frequency are typical and considered of no sonic importance. The preferred form of the overshoot control circuit illustrated in FIG. 2 possesses values complementary to, and provide overshoot compensation for, the example lowpass filter diagrammed in FIG. 3. Nevertheless, while this complementary relationship exists between the circuit of FIG. 2 and the circuit of FIG. 3, the overshoot control circuitry has been proven in practice to similarly provide compensation for a variety of active and passive lowpass filter designs of various orders. Additionally, the overshoot control circuit of the invention has been proven in practice to provide overshoot compensation for lowpass filter circuits utilized in applications other than FM broadcasting which, likewise, place simultaneous constraints on the amplitude and bandwith of an information signal.

In the interest of brevity in this descscription, the values of components utilized in the circuit have been shown in FIG. 2. All resistors are 5% carbon film type unless specified as 1%. Additionally, all of the operational amplifier sections are ½ National Semiconductor type LF353 or equivalent, and the diodes are general purpose type 1N4151 manufactured by Motorola, or equivalent.

Referring to FIG. 3, all resistors shown as 1%, the numeric value listed is in ohms, and the resistors are metal-film type. All capacitors shown are 0.0033 uF, 2.5%, polypropylene type, and all of the operational amplifiers are ½ National Semiconductor type LF353, or equivalent.

Having thus described the invention, what is thought to new and novel and sought to be protected by Letters Patent of the United States is as follows.

I claim:

1. A lowpass filter overshoot control circuit, comprising:
   (a) a first clipping circuit adapted to receive an information signal having a predetermined initial amplitude and operative to establish a subsequent signal amplitude limit for said information signal less than said predetermined amplitude;
   (b) a phase-lag network adapted to receive said amplitude limited information signal and operative to displace high frequency signal components with respect to low frequency signal components;
   (c) a second clipping circuit adapted to receive an output signal from said phase-lag network and operative to clip from said output signal said high frequency signal components that exceed in amplitude the amplitude-limited information signal whereby signal amplitude limits are reestablished;
   (d) a comparator circuit adapted to have signal inputs thereinto corresponding to output signals from said phase-lag network and said high frequency signal components output from said second clipper circuit; and
   (e) a summing amplifier circuit adapted to receive an amplitude-limited output signal from said second clipper circuit and said high frequency signal components from said comparator circuit and operative to re-combine said output signals into an amplitude-limited signal pre-conditioned to accommodate signal amplitude overshoot occurring in a lowpass filter receiving said pre-conditioned signal.

2. The combination according to claim 1, in which biasing means are provided operatively associated with said first clipping circuit to prevent signal amplitude excursions beyond a predetermined absolute limit.

3. The combination according to claim 1, in which signal delay means are operatively associated with said phase-lag network to delay high frequency signal components with respect to low frequency signal components.

4. The combination according to claim 2, in which a second clipping circuit is coupled to the output of the phase-lag network, and biasing means are provided operatively associated with said second clipping circuit to re-impose the same predetermined absolute limit as imposed by the biasing means associated with said first clipping circuit.

5. The combination according to claim 1, in which said comparator circuit monitors both the input to and the output from said second clipping circuit, whereby signal components clipped in the clipping process of said second clipping circuit are recovered.

6. The combination according to claim 5, in which said comparator functions to deliver an output signal comprised of recovered clipped signal components that are out-of-phase with the input signal.

7. The combination according to claim 1, in which means are provided for recombining an output of the comparator circuit with the output of the phase-lag network whereby said recombined signals represent a total output signal.

8. The combination according to claim 1, in which means are provided selectively adjustable whereby an output of the circuit complements the overshoot characteristics of a conventional lowpass filter when an input of the filter is connected to the output of the control circuit.

9. The method of preventing amplitude overshoot in a lowpass filter circuit adapted to be connected to a source of a primary information signal having a predetermined initial amplitude limit, comprising the steps of:
   (a) initially clipping said primary information signal to establish a subsequent signal amplitude limit for said information signal less than said primary information signal amplitude limit;
   (b) processing said subsequent amplitude-limited signal to displace high frequency signal components with respect to low frequency signal components where said high frequency signal components exceed in amplitude the amplitude of said subsequent amplitude-limited signal;
   (c) clipping said displaced high frequency signal components from said amplitude-limited signal when said high frequency signal components exceed in amplitude the amplitude-limited information signal;
   (d) inverting the phase of the high frequency signal components clipped from said amplitude-limited signal and combining said inverted high frequency signal components with said amplitude-limited signal to produce an intermediate output signal; and
   (e) re-combining the resultant intermediate output signal with said amplitude-limited signal whereby said amplitude-limited signal is pre-conditioned to accommodate signal amplitude overshoot occurring in a lowpass filter receiving said preconditioned signal.

* * * * *